United States Patent
Anderson et al.

(10) Patent No.: US 6,732,266 B1
(45) Date of Patent: May 4, 2004

(54) METHOD AND APPARATUS FOR RECONFIGURING CIRCUIT BOARD AND INTEGRATED CIRCUIT PACKET ARRANGEMENT WITH ONE-TIME PROGRAMMABLE ELEMENTS

(75) Inventors: Charles Anderson, Los Altos, CA (US); James J. Casto, Austin, TX (US); Alexander C. Tain, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 521 days.

(21) Appl. No.: 09/650,630

(22) Filed: Aug. 28, 2000

(51) Int. Cl.[7] .................. G06F 1/24; G06F 15/177; G06F 3/00
(52) U.S. Cl. .................. 713/100; 713/1; 713/300; 710/12; 710/14; 716/1
(58) Field of Search .................. 713/1, 100, 300; 710/102, 127, 129, 12, 14; 714/711; 257/529, 530, 797; 716/1

(56) References Cited

U.S. PATENT DOCUMENTS

| | | | | |
|---|---|---|---|---|
| 5,134,616 A | * | 7/1992 | Barth, Jr. et al. | 714/711 |
| 5,266,829 A | * | 11/1993 | Hamdy et al. | 257/530 |
| 5,536,968 A | * | 7/1996 | Crafts et al. | 257/529 |
| 5,546,563 A | * | 8/1996 | Chuang | 395/500 |
| 5,617,546 A | * | 4/1997 | Shih et al. | 710/127 |
| 5,675,772 A | * | 10/1997 | Liu et al. | 395/500 |
| 5,678,011 A | * | 10/1997 | Kim et al. | 710/102 |
| 5,748,031 A | * | 5/1998 | Best | 327/525 |
| 5,764,529 A | * | 6/1998 | Capps, Jr. et al. | 364/489 |
| 5,832,207 A | * | 11/1998 | Little et al. | 713/200 |
| 5,848,250 A | * | 12/1998 | Smith et al. | 710/129 |
| 5,938,769 A | * | 8/1999 | Hu | 713/300 |
| 5,987,553 A | * | 11/1999 | Swamy et al. | 710/129 |
| 5,998,295 A | * | 12/1999 | Madurawe | 438/666 |
| 6,002,182 A | * | 12/1999 | Madurawe | 257/797 |
| 6,101,319 A | * | 8/2000 | Hall | 395/183.18 |
| 6,108,199 A | * | 8/2000 | Bonardi et al. | 361/686 |
| 6,226,741 B1 | * | 5/2001 | Shen et al. | 713/100 |
| 6,369,437 B1 | * | 4/2002 | MacPherson et al. | 257/529 |
| 6,434,632 B1 | * | 8/2002 | Hall | 710/14 |

FOREIGN PATENT DOCUMENTS

WO 93/22730 * 11/1993

OTHER PUBLICATIONS

Takeshi Yamakawa A Fuzzy Programmable Logic Array (Fuzzy PLA), IEEE 1992, pp 459–465.*

"Add–On CPU Board", IBM Technical Disclosure Bulletin, Sep. 1994, vol. 37, pp 153–154.*

"Detection Mechanism between 386 or 486 Upgrade Processor Unit", IBM Technical Disclosure Bulletin, Dec. 1994, vol. 37, pp 119–120.*

* cited by examiner

*Primary Examiner*—Thomas Lee
*Assistant Examiner*—Chun Cao

(57) ABSTRACT

An arrangement and method of reconfiguring a circuit board and package arrangement employs one-time programmable elements on a package to allow a programmable first package arrangement having a first package board and a first integrated circuit to be readily replaced. The first package arrangement was programmed to operate with a first set of operating parameters. The replacement package arrangement, having a second package board and a second integrated circuit, may be substantially identical to the first package arrangement except programmed to operate with a second set of operating parameters different from the first set of op crating parameters. The replacement of the first package arrangement by the second, differently programmed package arrangement, provides a reconfigured circuit board and package arrangement while avoiding the obsoleting of the circuit board.

20 Claims, 8 Drawing Sheets

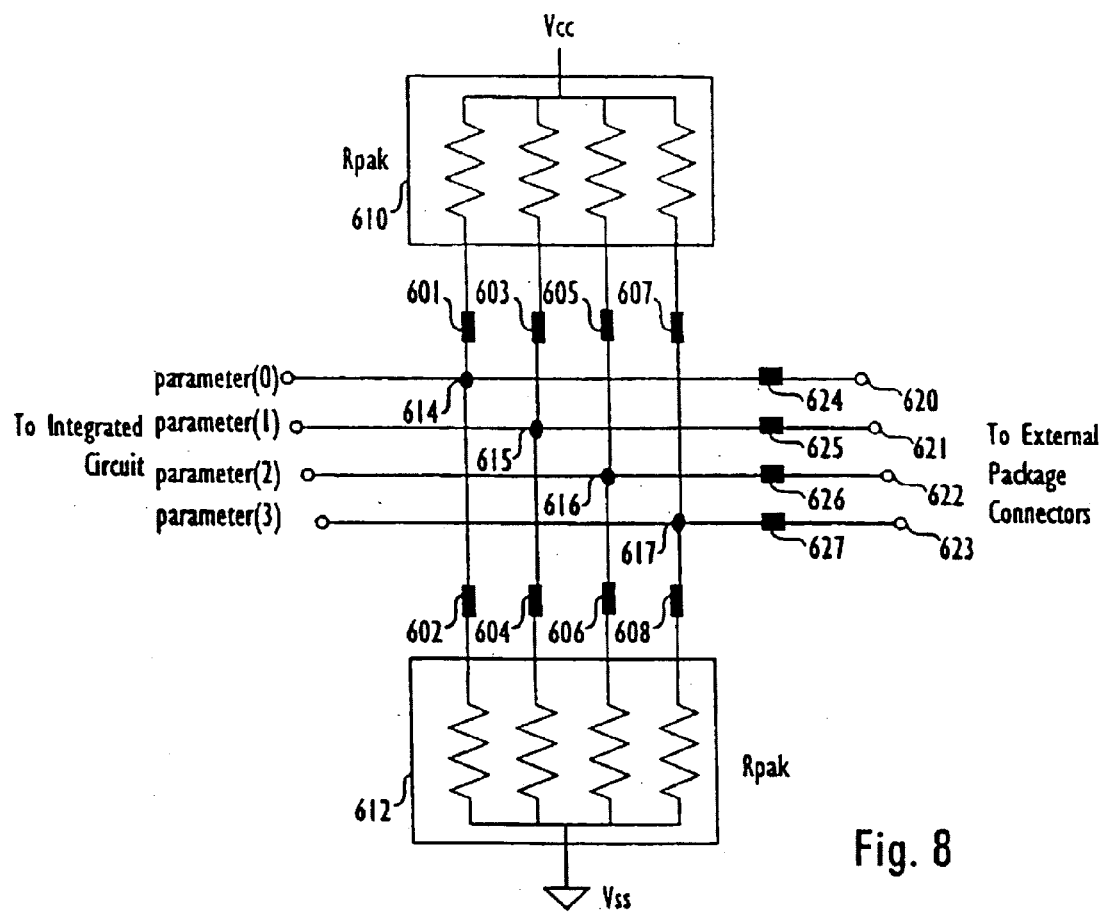
Fig. 8
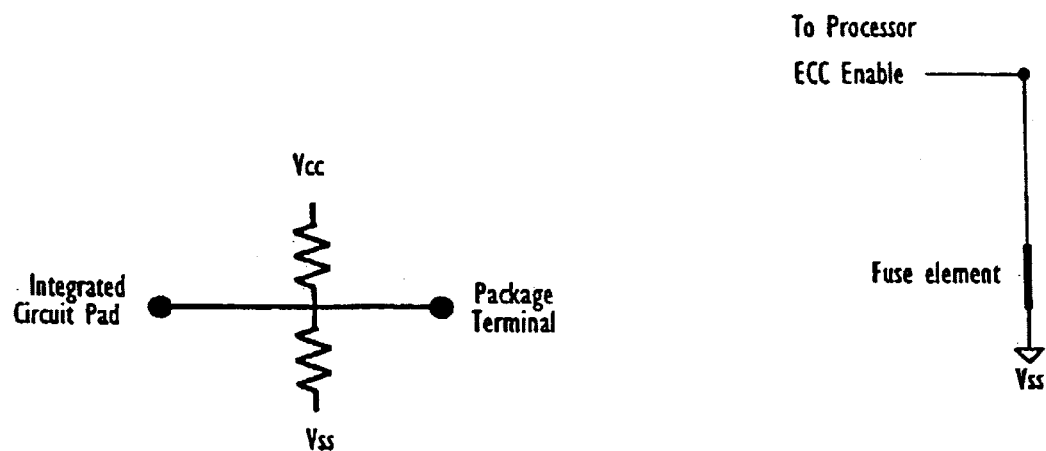
Fig. 9
Fig. 10

US 6,732,266 B1

METHOD AND APPARATUS FOR RECONFIGURING CIRCUIT BOARD AND INTEGRATED CIRCUIT PACKET ARRANGEMENT WITH ONE-TIME PROGRAMMABLE ELEMENTS

BACKGROUND OF THE INVENTION

1. Field of the Invention

The invention relates to integrated circuits, and more particularly, to the programming of integrated circuit packaging.

2. Description of the Related Art

Integrated circuits such as microprocessors can be run at different clock speeds and with different supply voltages. The determination of what is the appropriate clock speed and appropriate voltage depends on many factors. A higher clock speed requires a higher supply voltage. In addition, the higher clock speed results in additional heat and power being dissipated. Microprocessors utilized in mobile applications are particularly sensitive to power dissipation and generally require the lowest power dissipation and thus require the lowest supply voltage that can achieve the rated clock speed Microprocessors used in desktop applications are less sensitive to power dissipation considerations.

In general, microprocessor product yield, performance (MHz) and reliability are affected by the voltage supply setting. Within a range of only several hundred millivolts, dramatic differences can be seen in yield, performance and reliability, even from the same wafer lot. Choosing the best voltage is usually a compromise of yield, performance and reliability since the same value of voltage is usually chosen for a large population.

A higher percentage of a given population of microprocessors could operate at higher performance levels (thus creating higher revenue) if each microprocessor could operate at its own specific voltage. One solution would be to mark each processor with a number or symbol indicating its voltage and/or speed rating. However, that provides no guarantee that the appropriate voltage is supplied to the microprocessor in the final system.

Referring to FIG. 1, one prior art approach for providing the appropriate voltage and frequency values in a computer system is illustrated. Central processing unit (CPU) 101 receives bus frequency signals 103 (BF[2:0]), which provide a multiplier used by the processor to multiply a bus clock (not shown). The multiplied bus clock is used by the CPU to clock its internal logic. CPU 101 also receives core voltage 105 (commonly referred to in x86 architectures as Vcc2) from CPU core voltage regulator 107. Other voltages, which are typically supplied to the CPU, e.g., Vcc3 (I/O voltage) are not shown. Core voltage regulator 107 is programmable and receives voltage control inputs 109 (also referred to as voltage ID (VID) signals) which determine the voltage level supplied to CPU 101. The values for the both the VID signals and the BF pins are provided by the settings of jumpers 111.

It is conceivable to set the jumpers to correspond to the marking (number or symbol) on the processor that indicates its voltage and/or speed rating. However, that approach provides no guarantee that appropriate voltage and frequency settings will be utilized. In fact, certain unscrupulous suppliers of computer systems have been known to provide systems having higher than recommended voltages and frequencies. Since companies typically qualify and validate chips at certain voltage and frequencies, such overclocking or excessive voltage can result in shorter product lifetimes, decreased reliability and excessive product returns.

Providing information to users, which specifies the correct voltage and hoping that the correct voltage is subsequently supplied to the processor by circuitry on the board, is subject both to intentional misuse and unintentional error. In addition, the more possible voltage settings that are provided, the greater the possibility for error.

An additional factor to be considered is that if information on the preferred operating voltage and frequency for a specific chip is available only after testing that chip, programming that information on the die after testing requires that additional processing steps be performed on the die. Those additional processing steps may cause increased cost.

Another problem with jumper arrangements is that whenever a new integrated circuit and package is introduced, the jumper settings on the motherboard or other circuit board normally become obsolete. This makes it necessary for the consumer to either replace the entire notherboard or Circuit board or attempt to change the jumper settings, whenever a new integrated circuit, such as a microprocessor with a different operating frequency or circuit with a different operating voltage, is introduced. Average consumers do normally not have the training to change jumper settings on a circuit board in order to upgrade an integrated circuit. This leads to less frequent upgrading by consumers, who may not desire changing an entire motherboard or attempt to change jumper settings to upgrade, but would be more willing to upgrade if it only involved replacing the package and integrated circuit with a new integrated circuit and package.

Thus, there is a need to specify the correct operating parameters of an integrated circuit, such as a microprocessor, in a manner that allows eventual replacement of the integrated circuit with another integrated circuit with different operating parameters, without changing the circuit board or changing jumper settings on the circuit board.

SUMMARY OF THE INVENTION

This and other needs are met by embodiments of the present invention which provide a method of reconfiguring a circuit board and package arrangement in which a programmable first package arrangement having a first package substrate and a first integrated circuit is disconnected from a circuit board. This first package arrangement was previously programmed to operate with a first set of operating parameters. A programmable second package arrangement having a second package substrate and a second integrated circuit is then connected to the circuit board. This second package arrangement is substantially identical to the first package arrangement except it is programmed to operate with a second set of operating parameters different from the first set of operating parameters.

By providing a replaceable package arrangement, which is programmable, circuit board obsolescence is avoided. When a new integrated circuit design is introduced, having different operating parameters, such as operating frequency or voltage, the old package and integrated circuit previously programmed with the old operating frequency and voltage, is removed from the circuit board. A new package and integrated circuit, programmed with the new operating parameters, is then connected to the circuit board.

The earlier stated need is also met by another embodiment of the present invention that provides a circuit board and package arrangement comprising a circuit board with a socket configured to receive a package. The arrangement includes a replaceable package and integrated circuit die configured to electrically and removably connect to the socket The replaceable package is one-time programmable to adapt the package and integrated circuit die to programmed operating parameters.

The foregoing and other features, aspects, and advantages of the present invention will become more apparent from the following detailed description of the present invention when taken in conjunction with the accompanying drawings.

BRIEF OF THE DRAWINGS

FIG. 8 shows an embodiment in which the various embodiments shown in FIGS. 6–8 are combined.

FIG. 9 shows a schematic of the fuses shown in FIGS. 6–8.

FIG. 10 shows another embodiment in which a fuse provides ECC information to a processor.

The use of the same reference symbols in different drawings indicates similar or identical items.

DESCRIPTION OF THE PREFERRED EMBODIMENT(S)

The present invention addresses the problems associated with circuit board obsolescence, which may be caused by changed operating parameters of an integrated circuit die. These problems are solved, in part, by embodiments of the present invention that provide programming of the operating parameters on the package itself. This allows the replacement of a package programmed in accordance with a first set of operating parameters by another package programmed in accordance with a second set of operating parameters, without the need to change the circuit board settings.

Figure 1:
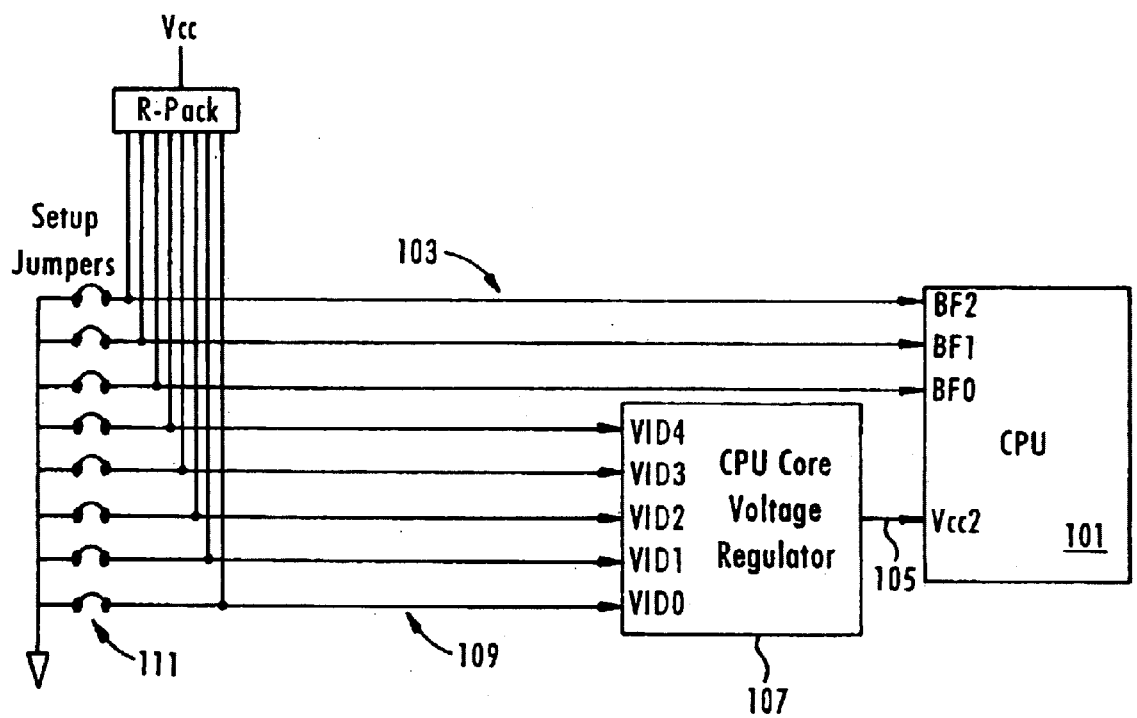
FIG. 1 shows a prior art approach to providing voltage and frequency settings.
Figure 2:
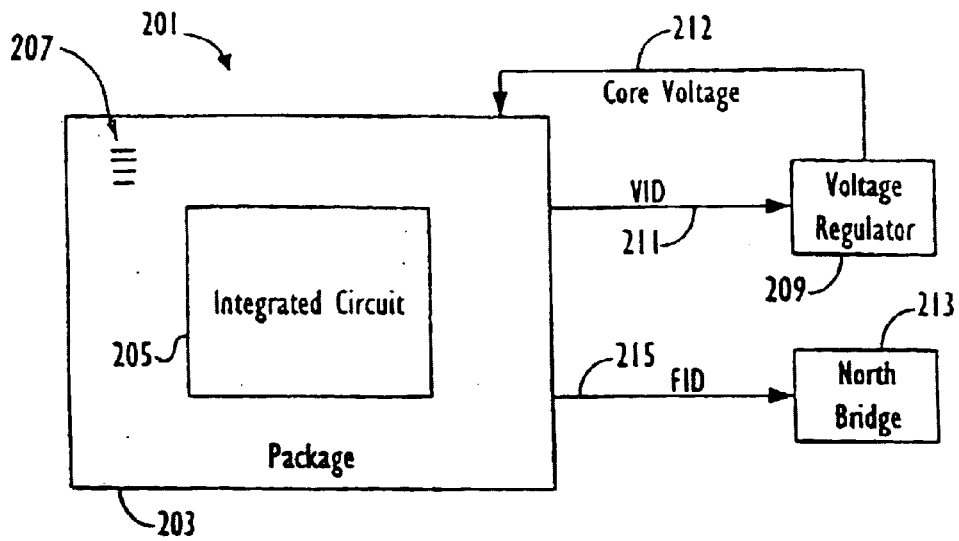
FIG. 2 illustrates a high level system view of one embodiment of the present invention.

Referring to FIG. 2, an overview of a system incorporating one embodiment of the present invention is illustrated. FIG. 2 shows microprocessor 201 which includes package 203 that holds integrated circuit die (also commonly referred to as chip) 205. Package 203 includes fuses 207. Based on the programming of fuses 207, the package supplies voltage regulator 209 with VID signals 211. Based on the VID signals, voltage regulator 209 supplies core voltage 212 to processor 201. In addition, the package may supply system controller 213 (e.g. a north bridge including a memory controller and a PCI bridge) with frequency ID signals 215 which indicate the system clock multiplier at which the processor core operates. The fuses may also supply one or more parameters to chip 205.

Package 203 includes a number of external connections such as those providing VID signals 211. Note that the term package as used herein is intended to include any integrated circuit carrier. The exact nature of the external connection between the package and the card to which it attaches, e.g., a motherboard or daughter card, varies according to the type of package. For example, connection between the package and the board may be through package pins such with Pin Grid Array (PGA) packages, or using other interconnection technologies such as tape automated bonding (TAB), chip scale package (CSP) technologies, or ball grid array (BGA) package.

In addition to the external connections, the package provides connections between chip 205 and package 203. The connection between chip and package varies according to the type of package. Typical package/chip interconnection technologies include wirebonding, flip chip connections and tape automated bonding (TAB) The connections between the package and the chip and the package and the board provide for signal input/output (I/O), which convey signal information to and from the integrated circuit chip. In addition to signal I/O, the package connections provide connections for Vss and Vcc.

A wide variety of package technologics exist that can exploit the present invention. The packages are typically multi-layered packages with vias providing interconnections between the various layers. For example, package 203 may be a multi-layer fiberglass laminate made of FR4 or FR5 fiberglass, Bismaleimide Triazine (BT) Resin, or other types of organic laminate structures known in the art. The packages described herein are exemplary only and any ceramic or organic package or other package formed of other suitable material that can accommodate programmable interconnections such as fuses may used in practicing the invention.

As shown in FIG. 2, fuses specifying operating parameters such as voltage may be formed on the surface of the package. The fuses may be formed by a metalization pattern on the package surface that connect through vias to other layers of the multilayer package and subsequently to interconnections between the chip and package, external package connections, or both. The metalization patterns may be screen printed metalization patterns.

A laser process (e.g., using a CO2, UV or a diode pumped Nd;YAG laser) may be used to program the fuses by ablating away a portion of the motalization pattern once the appropriate setting(s) for the fuse or array of fuses are known The amount of the fuse that is ablated away may vary. For instance, the programming of the fuse may only require a cut sufficient to provide an open circuit. Alternatively, substantially all of the conductive material residing on the surface of the package may be ablated away to minimize the risk of accidental (or intentional) shorting of the fuse afterwards. By programming an array of fuses, the appropriate "data" for operating the processor (e.g., voltage or frequency control values) may be specified. The fuse area on the package can then be covered with a suitable insulating material such as epoxy or silicone to prevent later tampering or accidental damage.

Figure 2A:
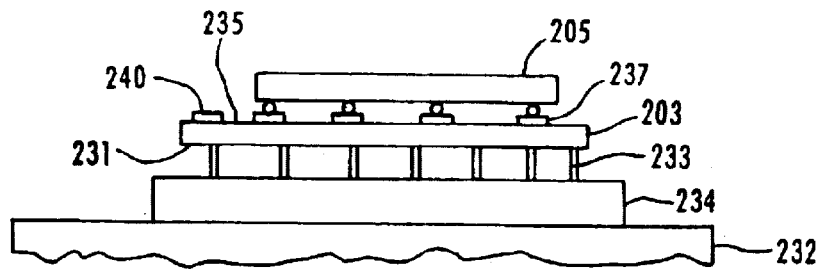
FIG. 2A depicts a side view of a circuit board and package arrangement constructed in accordance with embodiments of the present invention.

FIG. 2A depicts a schematic side view of a circuit board and package arrangement in accordance with embodiments of the present invention. The circuit board 232, which may be a motherboard, for example, includes a socket 234 configured to receive the pins of a package. A package 203 is received in the socket 234. The package 203 has a first side 231, with a set of first connectors 233 that are configured for electrically connecting the package 203 to the motherboard 232 through the socket 234. The first connectors 233 may be a set of pins, for example, that are received within recesses of the socket 234. This arrangement is exemplary only, however, as other types of connectors, such as soldered connections, may be employed.

The package 203 has a second side 235 that has second connectors 237 configured for electrically connecting integrated circuit 205 to the package 203. The integrated circuit 205, such as a microprocessor, for example, is designed to operate with certain operating parameters, such as operating frequency and operating voltage. As discussed, these operating parameters can be set (programmed) through the programmable element(s) 240 provided on the package 203. With improved designs, or even alternate designs, the operating parameters of the integrated circuit 205 can change. In accordance with the methods and apparatus of the present invention, obsolescence of the motherboard 232 is avoided, as explained below.

Figure 2B:
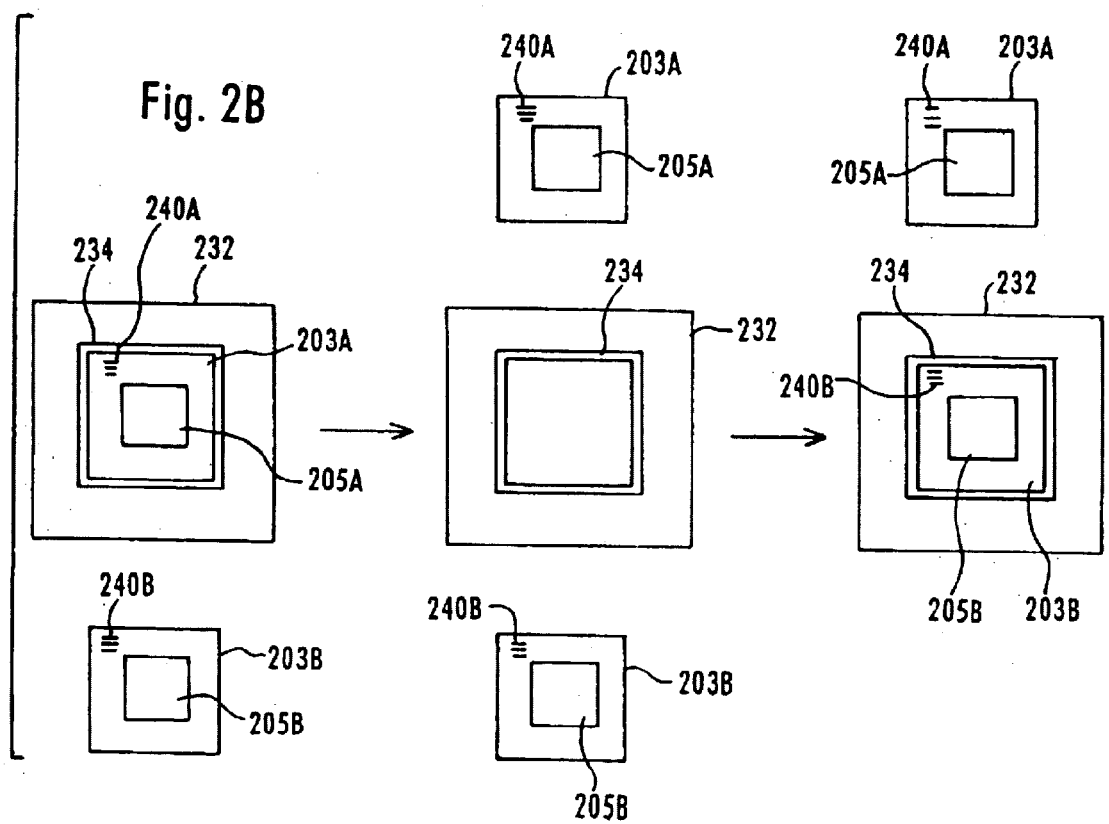
FIG. 2B is a schematic depiction of a circuit board and package arrangement with multiple replaceable package in a accordance with embodiments of the present invention.

Referring to FIG. 2B, a top schematic view of a replacement process in accordance with the present invention is provided. In the left hand side of the figure, a first package 203A to which a first integrated circuit 205A is connected, is seated within the socket 234 of circuit board 232. The first integrated circuit 205A is designed to function with a first set of operating parameters. Accordingly, the programmable element(s) 240A on the first package 203A have been programmed to these operating parameters.

When a second integrated circuit 205B, designed to function with a second set of operating parameters, becomes available, it is not necessary to discard the circuit board 232. Instead, as indicated in the middle diagram of FIG. 2B, the first package 203A is disconnected from the socket 234 attached to circuit board 232. The second package 203B is then connected into the socket 234, as indicated in the right hand side of FIG. 2B. This second package 203B, to which the second integrated circuit 205B has been connected, is programmed in accordance with the second set of operating parameters through the use of programming elements 240B on the second package 203B. This second set of operating parameters may be programmed either before or after the second package 203B has been inserted into the socket 234.

The reconfiguration of the circuit board and package arrangement with different operating parameters allows fast and relatively easy accommodation of different integrated circuits without discarding of the entire circuit board.

Figure 3A:
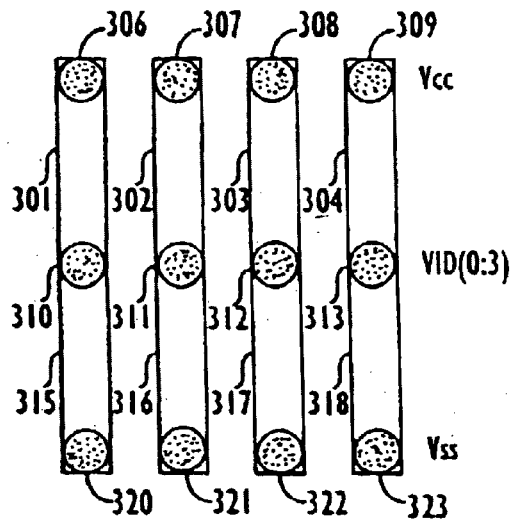
FIGS. 3A–3C illustrate various fuse configurations.
Figure 3B:
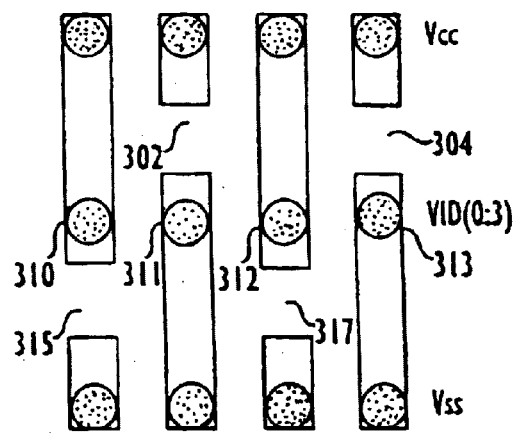
Figure 3C:
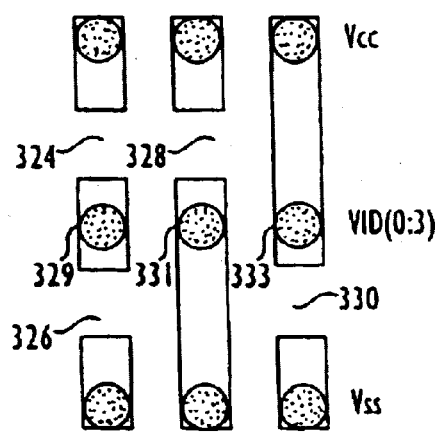

FIGS. 3A–3C illustrate various programming possibilities for exemplary fuses. The fuses are formed by metal traces, or other suitable conductors, which connect to vias, indicated by dark circles at each end of the fuse. The vias shown, in general connect to package pins (i.e. external package connections), package power supply nodes (Vss or Vcc) or internal package nodes that connect to the integrated circuit die when it is mounted on the package. The particular connection depends on the type of information intended to be specified by the fuses. FIG. 3A shows the fuses prior to programming.

The fuses shown in FIG. 3A determine four bits of information. Each bit requires at least one cut. As shown in FIG. 3A, the top row of fuses 301–304 couple through vias 306–309 to Vcc. The top row of fuses also connect to vias 310–313, which in turn are coupled to package pins to provide four VID bits for connection to a voltage regulator The bottom row of fuses 315–318 couple at one end through vias 320–323 to Vss. At the other end, the fuses couple to vias 310–313 and thus connect to one end to the top row of fuses 301–304.

Each of the fuses 301–304 and 315–318 include a fusible link coupling each end of the fuse formed by the metal trace or other suitable conductor. Referring to FIG. 3B, the programming shown provides a binary setting of 1-0-0-1 as the value of the fuses, where 1 is Vcc and 0 is Vss. That is, fuses 315 and 317 are blown causing vias 310 and 312 to be coupled only to Vcc. Fuses 302 and 304 are also blown causing vias 311 and 313 to be only coupled to Vss.

If the circuit that receives the value programmed by the fuses can differentiate an open circuit from both a high and low voltage, i.e., if the receiving circuit can utilize ternary logic, then additional voltage settings can be provided using fewer pins. For example, referring to FIG. 3C, three VID pins provide 27 separate options FIG. 3C shows a fuse programming of 1-0-2 where 2 is Vcc, 1 is floating and 0 is Vss That is, the fuses are blown at 324 and 326 to provide an open at node 329. Additionally, the fuses are blown at 328 and 330 to provide a 0 and 2 respectively on nodes 331 and 333.

In addition to the four package pins required in FIGS. 3A and 3B and the three package pins required in FIG. 3C, an additional package pin may be required in order to provide a special Vcc pin for testing purposes. Otherwise, the package may have its Vcc and Vss planes shorted together during testing of the package and integrated circuit, prior to programming of the fuses.

Note that the use of the term "package pin" is used herein for convenience in describing certain embodiments. While the term is used herein to sometimes describe pins of PGA packages, the term is also used generally herein and is intended to encompass any external connection or contact between the package and the board.

Rather than provide fuse pairs to determine each VID value as illustrated in FIGS. 3A–3C, alternatively a single fuse can be used to selectively couple a package pin to a power supply voltage. For example, referring to FIG. 4A, the values for VID are provided by fuses 401–404. Each bit requires at most one cut. Fuses 401–404 couple through vias 406–409 to external package connections and provide, e.g., four VID bits for connection to a voltage regulator. The fuses also connect to vias 410–413, which in turn are coupled to Vss.

Figure 4A:
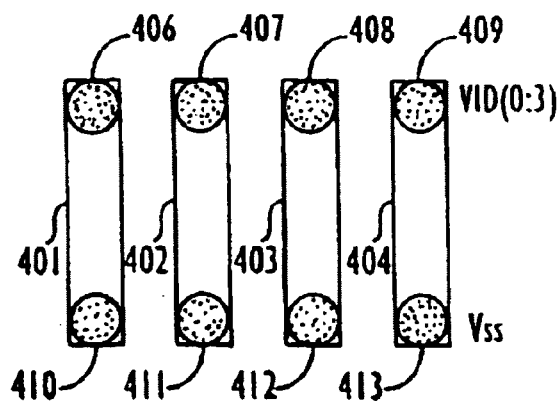
FIG. 4A–4B shows different views of another fuse configuration.
Figure 4B:
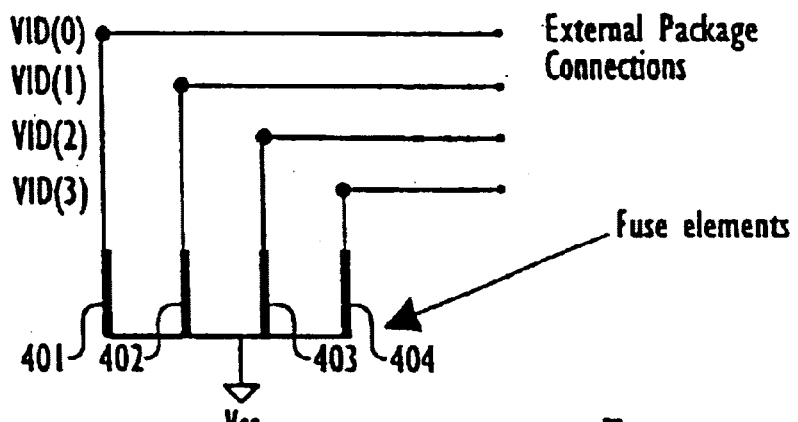
Figure 5:
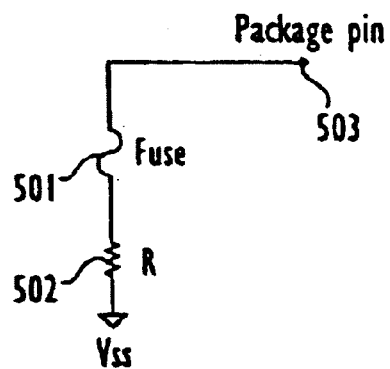
FIG. 5 shows a schematic of one of the fuses in FIGS. 4A or 4B.

If fuse 401 is blown, then the package pin is not connected to Vss. An external pull-up circuit is required to set the package pin to Vcc (unless the receiving circuit can distinguish an open from a ground). FIG. 413 shows another representation of the fuses shown in FIG. 4A. Each of the fuses shown in FIGS. 4A and 4B is represented by the circuit shown in FIG. 5, which shows fuse 501 coupled to Vss through a low resistance resistor 502 (0 ohms is acceptable) and to package pin 503. The configuration shown in FIG. 4 requires a maximum of only one cut per bit of information but does require external pull-up circuits. The minimum number of cuts for four bits of information is 0 while the maximum number of cuts is four. With the four fuses shown in FIGS. 3A or 4A, up to sixteen different voltage ID values may be specified. Cut here refers to blowing the fuse, typically using a laser, although other method are possible as described further herein.

While the power supply voltage on the package shown in the embodiment in FIGS. 4A and 4B is Vss, it is of course possible to instead provide a one-time programmable connection to Vcc on the package and have an external pull down circuit.

Other parameters may also be specified rather than voltage. For example, as described with relation to FIG. 2, frequency ID information may also be specified.

Figure 6:
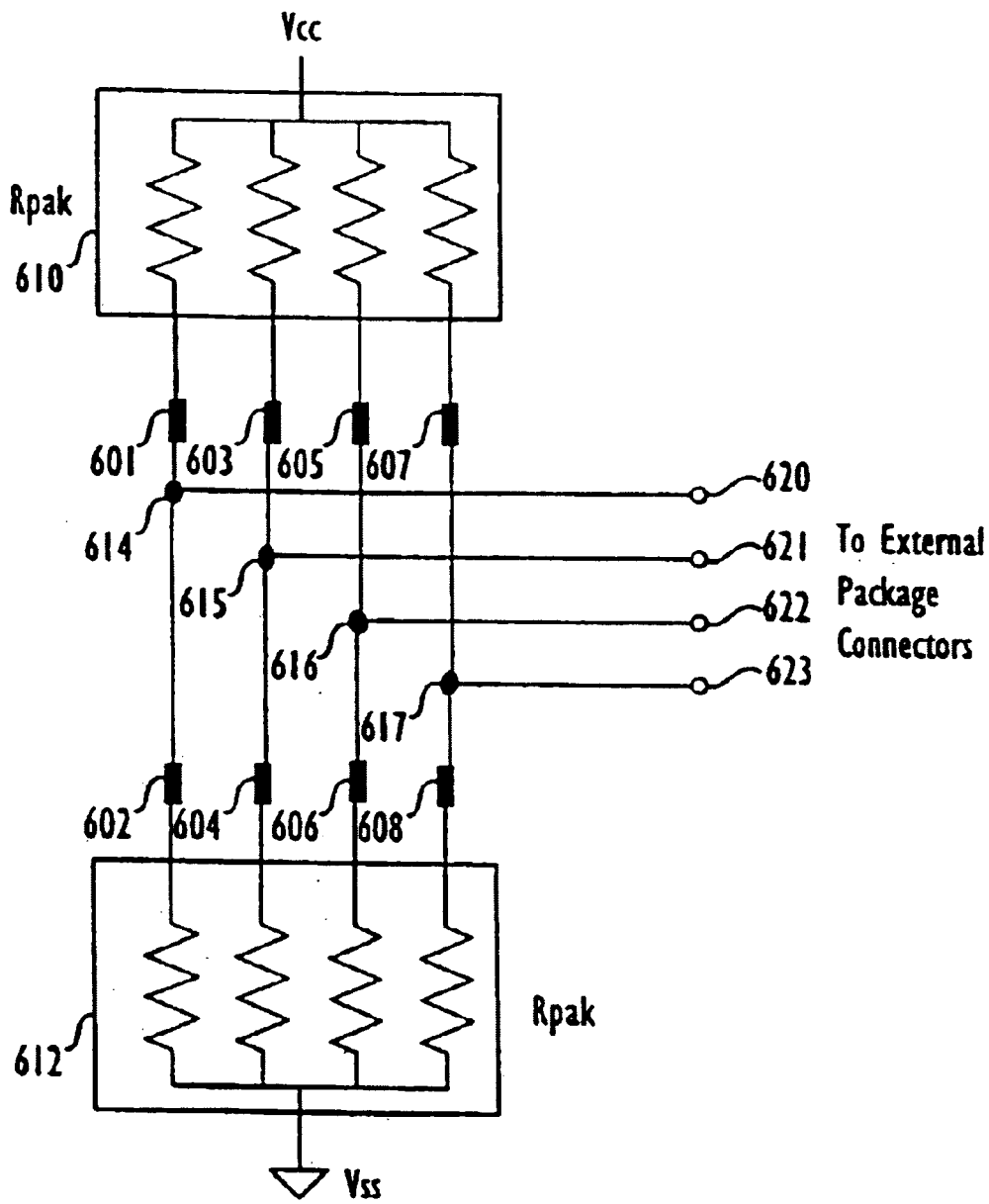
FIG. 6 shows another fuse configuration for providing information to package terminals.

Referring to FIG. 6, another fuse configuration is illustrated which provides four bits of information. The fuses are again configured in pairs (e.g., fuses 601 and 602) in a manner similar to FIGS. 3A–3C. The top fuses 601, 603, 605 and 607 of each pair couple to Vcc through resistors in resistor pack 610. The bottom fuse of each fuse pair, fuses 602, 604, 606 and 608, couple to Vss through resistors in resistor pack 612. The resistors provide a voltage divider function and thus, an extra test pin (to avoid having Vss shorted to Vcc during testing prior to programming of the fuses) may not be necessary. In the embodiment shown in FIG. 6, each of the fuse pairs couple respectively to common nodes 614–417. The common nodes 614–617 couple to external package connections, e.g., package pins. In other embodiments, the common nodes may couple only to external package connections (package pins) or only to the chip and not utilize package pins.

Figure 7:
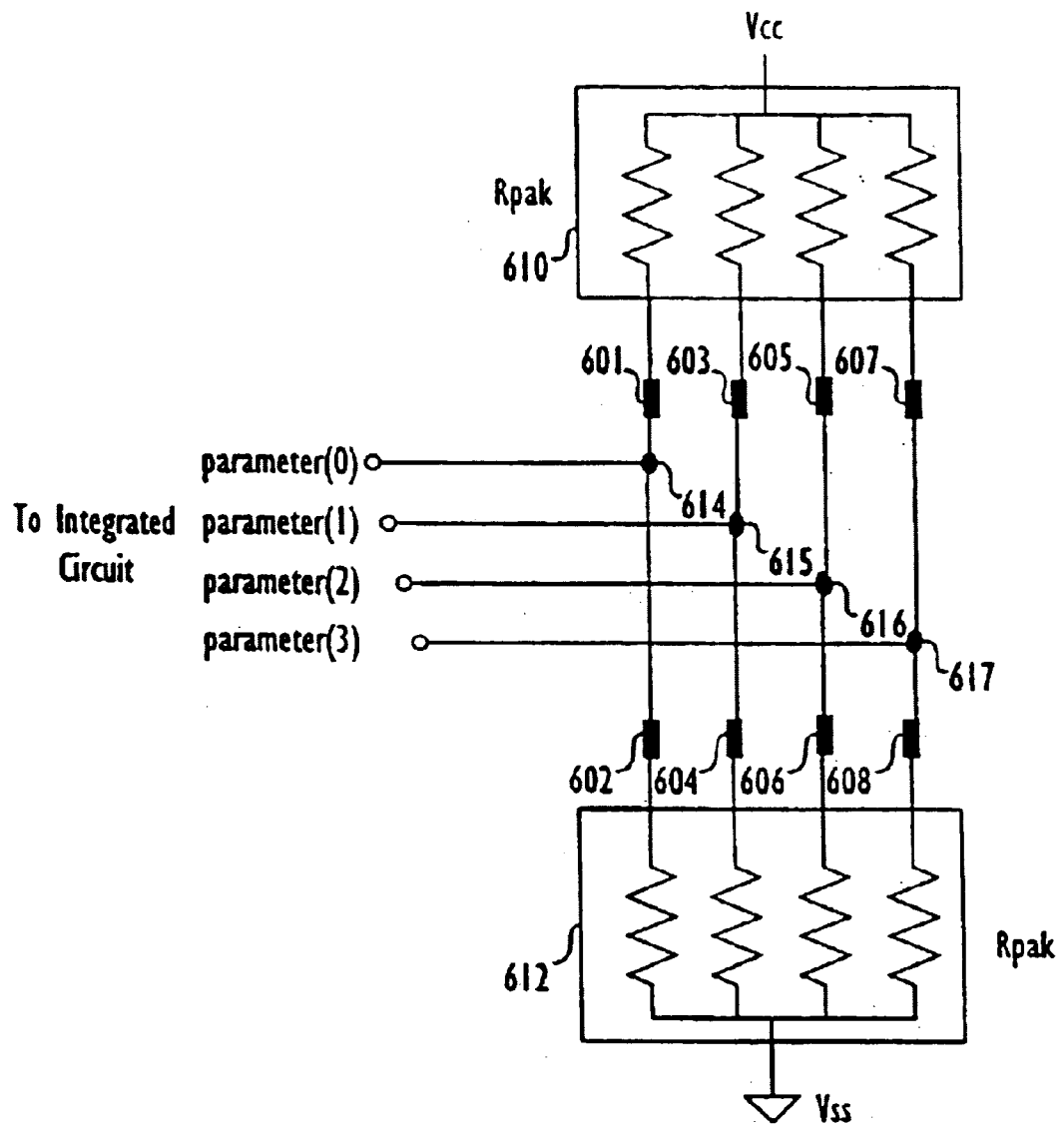
FIG. 7 shows another fuse configuration for providing information to input terminals of the integrated circuit die.

FIG. 7 illustrates an embodiment in which the value specified by the fuse array is provided to the integrated circuit instead of going to the package pins. Internal nodes 614–617 couple to, e.g., C4 pads coupling the die to the package. The fuse array may be specifying a voltage, frequency or other parameter to the integrated circuit die.

FIG. 8 illustrates an embodiment combining the features of FIGS. 6 and 7, but also includes fuse elements 624–627 that are coupled serially between common nodes 614–617 and external package pins 620–623. The fuse 624–627 provide a connection between the chip and the package pins during testing, but are removed prior to product shipping. A schematic of one of the fuse pairs in FIG. 6–8 is shown in FIG. 9.

In order to program the fuse configuration shown in FIGS. 6–9, at least one fuse of each pair must be blown to connect the common node to either Vcc or Vss. Thus, for four bits of information, four cuts are generally required. If three state logic is available then both fuses of a pair can be cut to represent a third value.

Referring to FIG. 10 another embodiment illustrates a fuse, without the voltage divider configuration used in FIGS. 6–9, providing a parameter value to the integrated circuit die mounted on the package. In the particular embodiment, a signal is provided to that selectively enables error correcting code (ECC) according to the state of the fuse. The ECC signal may be used, e.g., for an on-board cache for a microprocessor. An internal pull-up is required in the processor to specify a value if the fuse is not cut.

The description so far has described cutting fuses with lasers. Several alternative embodiments are also possible. For instance, while the fuses have been described as being laser programmable, the fusible links may also be programmed electrically in a manner known in the art. That is the fuses may be fabricated as electrically programmable fuses. Further, while the fuses have been described as being on the surface of the package, the fuses may actually be fabricated on internal layers of a multi-layer package and be fabricated out of a conductive material other than metal. If fuses are on a layer other than the surface of the package, then electrically programmable fuses may be preferred. Further, while the embodiments so fir have been described using fuses to provide one-time programmable interconnections to supply voltages and to external and internal package connections, antifuses may also be used. A fuse provides a normally short circuit that turns into an open circuit when fused, using either electrical or laser programming. An antifuse is another type of one-time programmable interconnect that is equally applicable in the context of the present invention. An antifuse provides a normally open circuit that is short circuited when fused. Thus, both the fuse and antifuse are structures having two ends connected by a programmable link that, on application of suitable laser or electrical programming results in either an open or short circuit, respectively.

Wherever embodiments have been described herein as using fuses, such as in FIGS. 2–10, other embodiments utilizing antifuses are also contemplated. In that case, programming is typically opposite of the fuse embodiments as is readily apparent to those of skill in the art. One advantage of using antifuses in the context of the present invention is that the extra Vcc pin that may be required in, e.g., FIGS. 3A–3C to avoid Vcc being shorted to Vss during test, may be eliminated.

Figure 11:
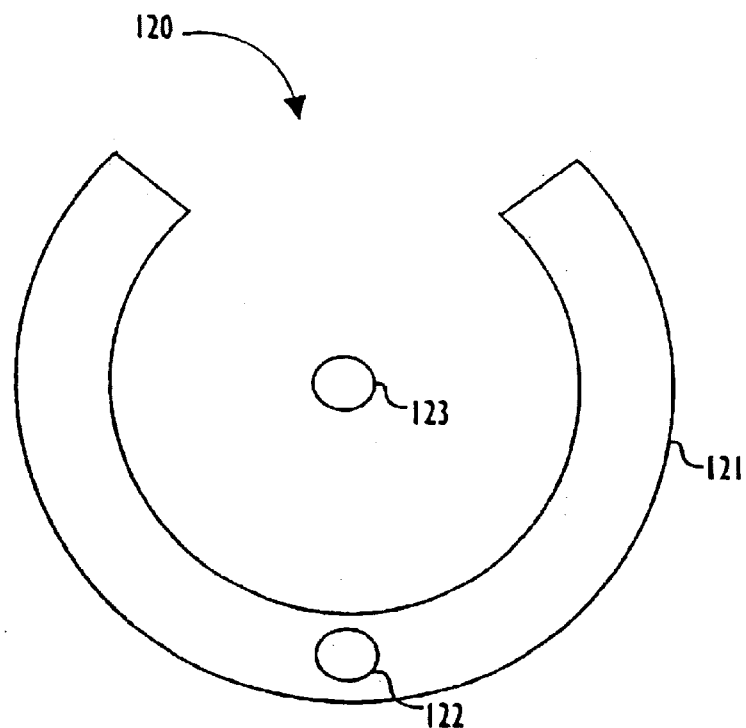
FIG. 11 shows one embodiment of an antifuse structure.

In one embodiment, an antifuse such as the one illustrated in FIG. 11 may be utilized. The antifuse 120 includes a generally circular conductive area 121 which is in electrical contact with via 122. Via 122 may couple, e.g., to a power supply node. Via 123 is not in electrical contact with via 123. If it is desired to short via 122 and 123 together, then conductive paste or solder may be deposited so as to form an electrical contact between via 123 and via 122 and circular conductive area 121. The conductive paste may then he subject to ultraviolet curing.

Figure 12:
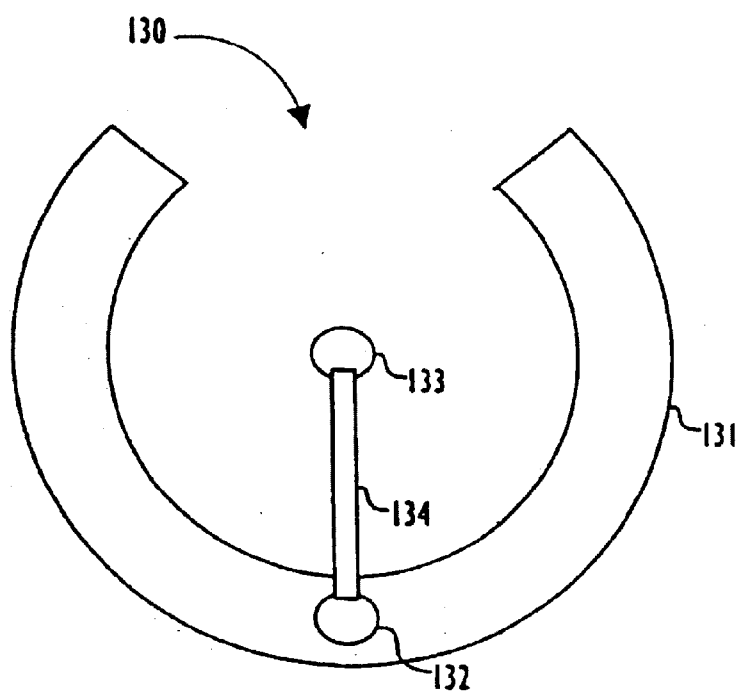
FIG. 12 shows an antifuse in parallel with a fuse.

In another embodiment, an antifuse is combined in parallel with a fuse to provide the capability of reversing a fuse cut. Referring to FIG. 12, antifuse 130 including circular conductive area 131 in electrical contact with via 132. In this embodiment, via 132 is electrically connected to via 133 via fuse 134. If fuse 134 is blown, that can be reversed at a later time by programming antifuse 130, i.e. shorting vias 133 and 132 using solder as described above. Other antifuse approaches may also be used.

While the embodiments have generally been described with relation to a package containing a single integrated circuit and particularly a microprocessor, multi-chip modules may advantageously exploit one or more of the various embodiments described herein. In addition, the invention is not restricted to microprocessors. Other types of integrated circuits may also utilize one or more of the various embodiments described herein.

One advantage of the present invention is that the testing procedures to characterize the part may be completed prior to programming of the fuses Thus, the part in question may complete tests on automatic test equipment (ATE) as well as system level tests. Once the tests are completed and the part is characterized in terms of voltage and speed, the package may be programmed without having to perform any further processing steps on the die or any further testing, except to check that the fuses were appropriately programmed. Of course, the fuses may be programmed prior to mounting the die if the values for the fuses are known.

Because each part may have its optimum voltage and/or other parameters specified, voltage parameters may be specified with more granularity. Thus, higher aggregate performance from a given population of microprocessors may be achieved by specifying the proper voltage that individual processors should receive. That is, the same value for voltage no longer has to be chosen for as large a population of microprocessors. Of course, the system in which the packaged part is utilized must be able to exploit any signals specified by the fuses and provided to the system.

The methods and apparatus of the present invention allow for the reconfiguration of a circuit board and package arrangement without the need to discard or reconfigure the circuit board itself. This permits upgrading or changing the integrated circuit die connected to the board, even when it has different operating parameters, without obsoleting the board.

The description of the invention set forth herein is illustrative, and is not intended to limit the scope of the invention as set forth in the following claims. Variations and modifications of the embodiments disclose herein, may be made based on the description set forth herein, without departing from the scope and spirit of the invention as set forth in the following claims.

What is claimed is:

1. A method of reconfiguring a circuit board and package arrangement, comprising the steps of:

physically and electrically disconnecting from a circuit board a programmable first package arrangement having a first package substrate and a first integrated circuit, the first package arrangement being programmed to operate with a first set of operating parameters; and physically and electrically connecting to the circuit board a programmable second package arrangement having a second package substrate and a second integrated circuit, this second package arrangement being substantially identical to the first package arrangement except programmed to operate with a second set of operating parameters different from the first set of operating parameters, wherein:

each package substrate comprises at least one pair of one-time programmable elements, each element having a first end and a second end separated by a programmable link, wherein the first end of each one-time programmable element of a pair is coupled to a power supply voltage node in the package and the second end of each one-time programmable element of a pair is coupled to a same internal package node, with one of the pair of one-time programmable elements being a fuse and the other of the pair of one-time programmable elements being an anti-fuse, the one-time programmable elements of a pair being programmable opposite and separately in time to provide reprogammability of the second package.

2. The method of claim 1, wherein the programmable elements are programmed by altering the condition of the programmable link.

3. The method of claim 1, wherein each package is a multilayered package and each programmable element of the at least one pair is formed of a metalization pattern located on a surface of each package.

4. The method of claim 1, wherein each package is a multilayered package and each programmable element of the at least one pair is located on a layer other than the surface of the package.

5. The method of claim 1, wherein the second end of each programmable element of the at least one pair is coupled to at least one of an external package connection and a package contact that connects to an input terminal of the integrated circuit die, after mounting of the integrated circuit die.

6. The method of claim 1, wherein each programmable element of the at least one pair is coupled to the power supply terminal through a resistive element.

7. The method of claim 1, wherein the second end of each programmable element of the at least one pair is coupled to an external package connection and to an internal package node that couples to an input terminal of the integrated circuit die when the integrated circuit die is mounted.

8. The method of claim 1, wherein at least one of the programmable elements is programmed using a laser.

9. The method of claim 1, wherein at least one of the programmable elements is programmed using an electrical current.

10. A circuit board and package arrangement comprising:
a circuit board with a socket configured to receive a package;

a replaceable package and integrated circuit die configured to electrically and removably connect to the socket, the replaceable package having at least one pair of one-time programmable elements, each element having a first end and a second end separated by a programmable link, wherein the first end of each one-time programmable element of a pair is coupled to a power supply voltage node in the package and the second end of each one-time programmable element of a pair is coupled to a same internal package node, with one of the pair of one-time programmable elements being a fuse and the other of the pair of one-time programmable elements being an anti-fuse to adapt the package and integrated circuit die to programmed operating parameters, the one-time programmable elements of a pair being programmable oppositely and separately in time to provide reprogammability of the package.

11. The arrangement of claim 10, wherein the first end of each one-time programmable element is coupled to a power supply voltage node in the package and a second end of each programmable element is coupled to an internal package node.

12. The arrangement of claim 11, wherein the one or more programmable elements specify one or more operating parameters relating to the circuit board.

13. The arrangement of claim 12, wherein the integrated circuit die includes a processor and the one or more operating parameters specify an operating voltage of at least a portion of the processor.

14. The arrangement of claim 13, wherein the internal package node is coupled to at least one of an external package connection and the integrated circuit die.

15. The arrangement of claim 14, wherein the internal package node couples to an external package connection through another programmable element.

16. The arrangement of claim 15, wherein the package is a multilayered package and the programmable element is located on a surface of the package.

17. The arrangement of claim 16, wherein the package is a multilayered package and the programmable element is located on a layer other than the surface of the package.

18. The arrangement of claim 17, wherein the one or more programmable elements, when programmed, specify a control value relating to clock frequency at which the processor operates.

19. The arrangement of claim 18, wherein a state of the programmable element specifies use of error correction code (ECC) for a cache memory on the processor.

20. The arrangement of claim 19, further comprising a first resistive element coupled respectively between the internal package node and the first power supply node and a second resistive element coupled between the internal package node and the second power supply node, thereby providing a voltage divider when the first power supply node is electrically coupled to the second power supply node through the programmable element pair.

* * * * *